(12) United States Patent
Isohata

(10) Patent No.: US 9,236,868 B2
(45) Date of Patent: Jan. 12, 2016

(54) ELECTRONIC DEVICE, ELECTRONIC APPARATUS, AND MOVING OBJECT

(71) Applicant: SEIKO EPSON CORPORATION, Tokyo (JP)

(72) Inventor: Kensaku Isohata, Kamiina-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/257,439

(22) Filed: Apr. 21, 2014

(65) Prior Publication Data

US 2014/0320222 A1    Oct. 30, 2014

(30) Foreign Application Priority Data

Apr. 25, 2013    (JP) ................. 2013-092067

(51) Int. Cl.
*H03L 1/04* (2006.01)
*H03L 1/02* (2006.01)

(52) U.S. Cl.
CPC . *H03L 1/04* (2013.01); *H03L 1/028* (2013.01)

(58) Field of Classification Search
CPC ...................................................... H01L 41/08
USPC ............................................ 331/70; 310/343
See application file for complete search history.

(56) References Cited

U.S. PATENT DOCUMENTS

| 6,133,674 A * | 10/2000 | Fry ............................ 310/343 |
| 7,514,852 B2 | 4/2009 | Kasahara et al. |
| 8,049,572 B2 | 11/2011 | Arai et al. |

FOREIGN PATENT DOCUMENTS

| JP | A-07-050523 | 2/1995 |
| JP | A-2007-006270 | 1/2007 |
| JP | A-2009-200817 | 9/2009 |

* cited by examiner

*Primary Examiner* — Joseph Chang
(74) *Attorney, Agent, or Firm* — Oliff PLC

(57) ABSTRACT

An electronic device includes a resonator provided with a heating element, and a circuit component opposed to the heating element, and provided with at least an oscillating amplifier element, and a distance between the heating element and the circuit component is in a range not smaller than 0 mm and no larger than 1.5 mm.

11 Claims, 8 Drawing Sheets

ELECTRONIC DEVICE, ELECTRONIC APPARATUS, AND MOVING OBJECT

BACKGROUND

1. Technical Field

The present invention relates to an electronic device, and an electronic apparatus and a moving object each equipped with the electronic device.

2. Related Art

In the past, further miniaturization and height reduction of an electronic device including a resonation device such as a quartz crystal resonator has been demanded due to miniaturization and height reduction of an electronic apparatus, and at the same time, reduction of the power consumption has also been demanded in order for achieving energy saving. In particular, the electronic device such as an oven controlled crystal oscillator (OCXO), which includes a thermostatic oven for heating the quartz crystal resonator with a heating element to keep the ambient temperature of the quartz crystal resonator constant in order to avoid an influence of the ambient temperature to obtain high frequency stability, has a problem that the power consumption is high since the heat from the heating element is transferred to a substrate, and is radiated to the outside of the OCXO.

In order to solve such a problem, in JP-A-7-50523, there is disclosed a method in which there is adopted a structure of supporting a substrate provided with the quartz crystal resonator attached with the heating element in a state of being separated from a case base using a support member, and a foil-like heat-insulating material is partially attached in a scattered manner on a surface of a case for covering these constituents, and thus, the heat to be radiated outside from the case is suppressed to achieve the reduction of power consumption.

Further, in JP-A-2009-200817, there is disclosed a method in which there is adopted in a substrate provided with the quartz crystal resonator a structure of disposing a heating film resistor and a temperature-sensitive film resistor on an upper surface of the substrate having a surface opposed to the lower surface of the quartz crystal resonator, and supporting the substrate in a state being separated from the case base using a support member, and the followability of the operating temperature with respect to the external temperature variation is enhanced, and the heat radiated outside from the case is suppressed to achieve the reduction of power consumption.

However, since the OCXO described above does not keep the ambient temperature of the oscillator circuit for oscillating the quartz crystal resonator constant with respect to the external temperature variation, there is a problem that the frequency stability is deteriorated due to the temperature characteristics provided to the oscillator circuit.

SUMMARY

An advantage of some aspects of the invention is to solve at least a part of the problems described above, and the invention can be implemented as the following forms or application examples.

Application Example 1

This application example is directed to an electronic device including a resonator provided with a heating element, and a circuit component opposed to the heating element, and provided with at least an oscillating amplifier element, and a distance between the heating element and the circuit component is in a range not smaller than 0 mm and no larger than 1.5 mm.

According to this application example, since the heating element provided to the resonator and the circuit component provided with the oscillating amplifier element are disposed so as to be opposed to each other, and the distance between the heating element and the circuit component is set to a value within the range not smaller than 0 mm and no larger than 1.5 mm, and thus, the oscillating amplifier element provided to the circuit component is kept at constant temperature due to the heat transfer and the radiation heat from the heating element, the variation in oscillation frequency of the resonator caused by the temperature characteristics provided to the oscillating amplifier element can be suppressed to a low level, and thus there is an advantage that the frequency stability of the electronic device can further be improved.

Application Example 2

This application example is directed to the electronic device according to the application example described above, wherein the distance between the heating element and the circuit component is in a range not smaller than 0 mm and no larger than 1.2 mm.

According to this application example, since the distance between the heating element and the circuit component is set to a value within the range not smaller than 0 mm and no larger than 1.2 mm, and thus, the oscillating amplifier element provided to the circuit component is kept at constant temperature due to the heat transfer and the radiation heat from the heating element, the variation in oscillation frequency of the resonator due to the temperature characteristics provided to the oscillating amplifier element can be suppressed to a low level, and thus there is an advantage that the frequency stability of the electronic device can further be improved. Further, by setting the distance to a value within the smaller range of no larger than 1.2 mm, the efficiency of the heat transfer is improved, and there is an advantage that the current consumption for keeping the oscillating amplifier element at constant temperature can be suppressed to a low level.

Application Example 3

This application example is directed to the electronic device according to the application example described above, wherein the distance between the heating element and the circuit component is in a range not smaller than 0.1 mm and no larger than 0.8 mm.

According to this application example, since the oscillating amplifier element provided to the circuit component can more efficiently receive the radiation heat from the heating element by setting the distance between the heating element and the circuit component to a value within the range not smaller than 0.1 mm and no larger than 0.8 mm, the oscillating amplifier element can further be kept at constant temperature. Therefore, since the variation in the oscillation frequency due to the temperature characteristics provided to the oscillating amplifier element can be suppressed to a lower level, and at the same time, the current consumption for keeping the oscillating amplifier element at constant temperature can be suppressed to a low level, there is an advantage that the frequency stability of the electronic device can further be improved, and at the same time, the current consumption can further be reduced.

Application Example 4

This application example is directed to the electronic device according to the application example described above, wherein the heating element covers the circuit component in a plan view.

According to this application example, since the circuit component is covered by the heating element in the plan view, and thus, the heat of the heating element can efficiently be transferred to the circuit component, the temperature of the circuit component can further be kept constant, and there is an advantage that the frequency stability of the electronic device can further be improved.

Application Example 5

This application example is directed to the electronic device according to the application example described above, wherein the circuit component is provided with at least an inductor and a variable capacitance element.

According to this application example, since the inductor and the variable capacitance element, which are large in variation in the constant value with the variation in the ambient temperature, can be kept at constant temperature by disposing the circuit component including the inductor and the variable capacitance element close to the heating element, there is an advantage that it is possible to further stabilize the temperature characteristics of the oscillator circuit for oscillating the resonator to thereby further improve the frequency stability of the electronic device.

Application Examples 6, 7, and 8

These application examples are directed to the electronic device according to the application example described above, wherein the electronic device further includes a first support section disposed on the resonator, a substrate having the circuit component disposed, and provided with a second support section, and a package housing the resonator and the substrate, the first support section is connected to the substrate, and the second support section is connected to the package.

According to these application examples, since the resonator provided with the heating element and the substrate provided with the circuit component including the oscillating amplifier element are set to a state separated from the base substrate of the package using the second support section, it is possible to reduce the heat of the heating element transferred to the outside through the base substrate of the package to thereby effectively use the heat of the heating element. Therefore, it becomes possible to reduce the current consumption, and thus, there is an advantage that the electronic device with low power consumption can be obtained.

Application Example 9

This application example is directed to an electronic apparatus including the electronic device according to the application example described above.

According to this application example, there is an advantage that the electronic apparatus provided with the electronic device superior in frequency stability and low in power consumption can be obtained.

Application Example 10

This application example is directed to a moving object including the electronic device according to the application example described above.

According to this application example, there is an advantage that the moving object provided with the electronic device superior in frequency stability and low in power consumption can be configured.

BRIEF DESCRIPTION OF THE DRAWINGS

The invention will be described with reference to the accompanying drawings, wherein like numbers reference like elements.

FIGS. 1A and 1B are schematic configuration diagrams of an electronic device according to an embodiment of the invention, wherein FIG. 1A is a schematic plan view showing the inside of the electronic device, and FIG. 1B is a cross-sectional view along the A-A line.

FIGS. 5A through 5C are diagrams showing the temperature characteristics with respect to the distance between the heating element and the circuit component of the electronic device according to the embodiment of the invention, wherein. FIG. 5A shows the case in which the distance is 0 mm, FIG. 5B shows the case in which the distance is 0.5 mm, and FIG. 5C shows the case in which the distance is 1.5 mm.

DESCRIPTION OF EXEMPLARY EMBODIMENTS

Some embodiments of the invention will hereinafter be explained in detail with reference to the accompanying drawings.

Electronic Device

Figure 1A:
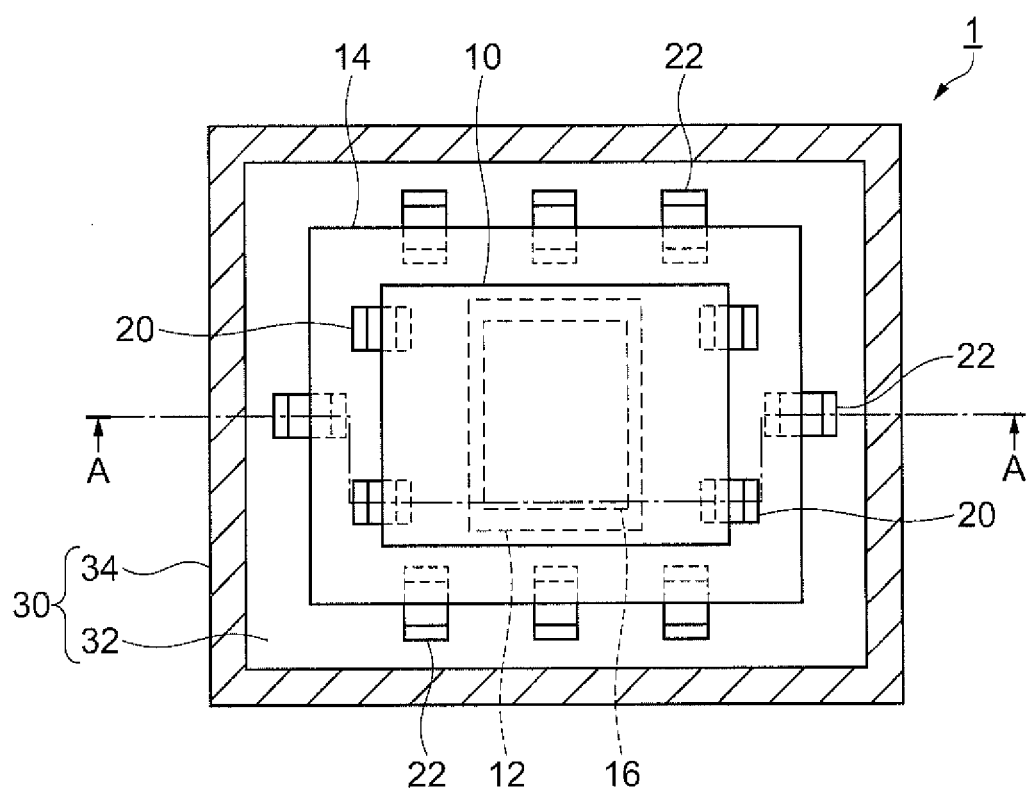
Figure 1B:
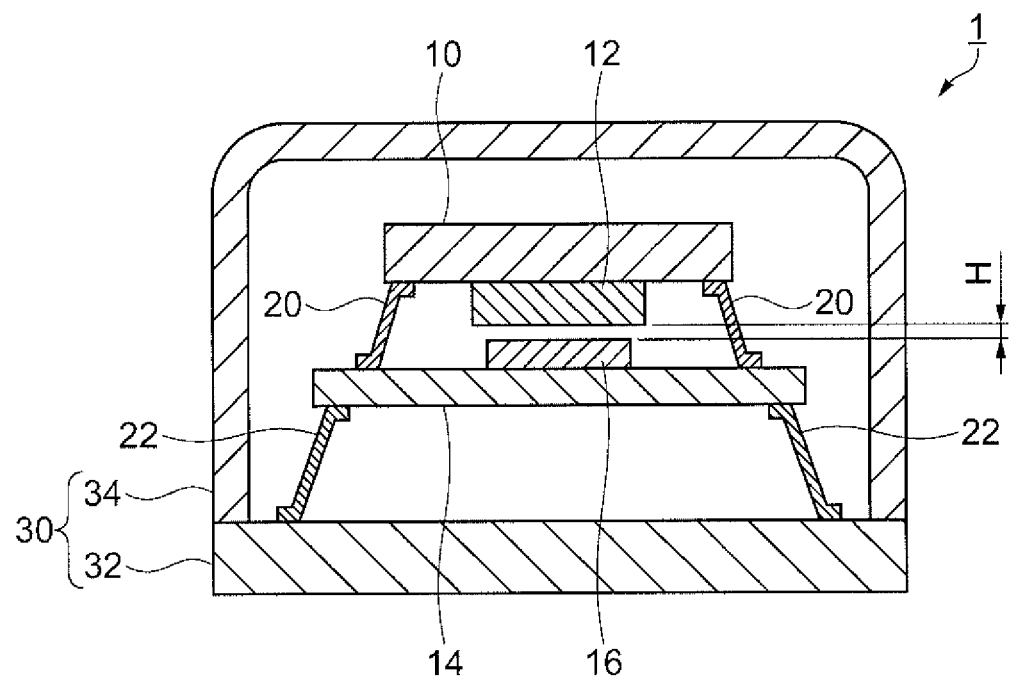
Figure 2:
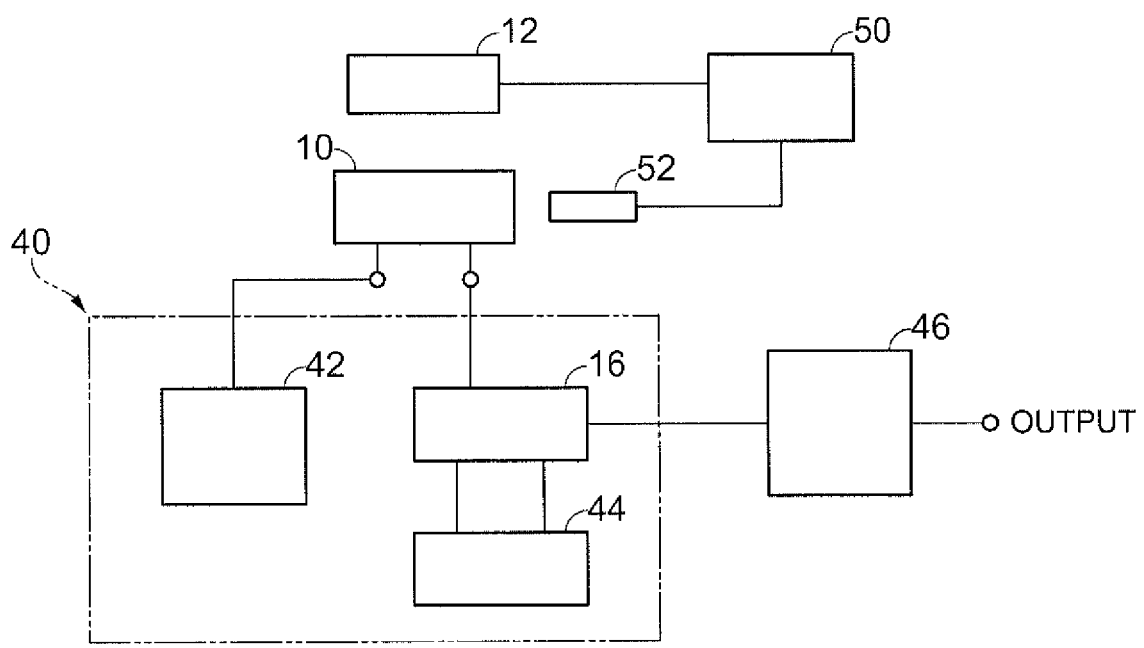
FIG. 2 is a block diagram showing a circuit configuration of the electronic device according to the embodiment of the invention.

FIGS. 1A and 1B are schematic configuration diagrams of the electronic device according to the embodiment of the invention, wherein FIG. 1A is a schematic plan view showing the inside of the electronic device, and FIG. 1B is a cross-sectional view along the A-A line in FIG. 1A. Further, FIG. 2 is a block diagram showing a circuit configuration of the electronic device according to the embodiment of the invention. It should be noted that in FIG. 1A, there is shown the state of removing an upper part of a cover 34 for the sake of convenience of explanation of an internal configuration of the electronic device 1.

The electronic device 1 shown in FIGS. 1A and 1B is configured including a resonator 10 provided with a heating element 12, a substrate 14 provided with a circuit component 16, first support sections 20 connected to the substrate 14 and for supporting the resonator 10, second support sections 22 connected to a base substrate 32 of a package 30 and for supporting the substrate 14, and the package 30.

The resonator 10 has a vibrating element installed inside a package made of ceramic or the like. Further, the inside of the package of the resonator 10 is airtightly sealed in a reduced-pressure atmosphere or an atmosphere with an inert gas such as nitrogen.

On one principal surface of the resonator 10, there are fixed the heating element 12 and one end portions of the first support sections 20 with a bonding material such as solder, metal bumps, or an electrically-conductive adhesive.

On one principal surface of the substrate 14, there are fixed the circuit component 16 including an oscillating amplifier element, and the other end portions of the first support sections 20 for supporting the resonator 10 with a bonding material such as solder, metal bumps, or an electrically-conductive adhesive, and the heating element 12 fixed to the resonator 10 and the circuit component 16 fixed to the substrate 14 are disposed so as to be opposed to each other. Further, on the other principal surface of the substrate 14, there are fixed one end portions of the second support sections 22 with a bonding material such as solder, metal bumps, or an electrically-conductive adhesive.

As shown in FIG. 1B, in the electronic device 1, since the heating element 12 and the circuit component 16 are disposed so as to be opposed to each other with a distance H, and are disposed so that the heating element 12 covers the circuit component 16, it becomes easy for the heat of the heating element 12 for heating the resonator 10 to efficiently be transferred by radiation, and thus, the circuit component 16 including the oscillating amplifier element having the temperature characteristics can be kept at constant temperature. Therefore, it is possible to prevent deterioration of the frequency stability due to the characteristic variation of the oscillating amplifier element generated by the variation in the ambient temperature of the package 30, and thus, the electronic device 1 having superior frequency stability can be obtained.

The package 30 is composed of the base substrate 32 and the cover 34, and on one principal surface of the base substrate 32, there are fixed the other end portions of the second support sections 22 for supporting the substrate 14 with a bonding material such as solder, metal bumps, or an electrically-conductive adhesive. According to such a structure as described above, since the resonator 10 provided with the heating element 12 and the substrate 14 provided with the circuit component 16 including the oscillating amplifier element are set to a state separated from the base substrate 32 of the package 30 using the second support sections 22, it is possible to reduce the heat of the heating element 12 transferred to the outside through the base substrate 32 of the package 30 to thereby effectively use the heat of the heating element 12. Therefore, it becomes possible to reduce the current consumption, and thus, the electronic device 1 with low power consumption can be obtained.

The cover 34 covers the resonator 10 and the substrate 14, and is bonded to the base substrate 32. The inside of the package 30 covered by the cover 34 and the base substrate 32 is sealed for preventing the heat from being released due to inflow and outflow of the gas. It should be noted that the inside of the package 30 can be sealed in a reduced-pressure atmosphere such as vacuum in order to prevent the heat from being released due to the thermal transfer by the gas. Further, the positions of the second support sections 22 fixed to the substrate 14 are preferably arranged as distantly as possible from the positions of the first support sections 20 fixed to the substrate 14 in order to reduce the heat transfer through the substrate 14.

It should be noted that in the explanation of the electronic device according to the embodiment of the invention, there is omitted the graphic description of the other circuit components disposed on the principal surface of the resonator 10, both of the principal surfaces of the substrate 14, and the principal surface of the base substrate 32 such as a control circuit for the heating element 12 or the oscillator circuit for the resonator 10.

The substrate 14 and the base substrate 14 are formed of a material having an insulating property such as ceramics or glass epoxy. Further, the electrodes and terminals, and electrode wiring and through electrodes for electrically connecting these electrodes and terminals provided to the substrate 14 and the base substrate 32 are typically formed using a method of printing a metal material such as tungsten (W) or molybdenum (Mo) on the substrate by screen printing, calcining the material, and then performing plating of nickel (Ni), gold (Au), or the like on the material, or a method of etching a substrate provided with a copper foil on the entire surface.

The first support sections 20 and the second support sections 22 are each formed of a metal material such as copper (Cu) or an alloy of iron (Fe) and nickel (Ni). By using the metal material having a high thermal conductivity such as copper (Cu) for the first support sections 20, the heat of the heating element 12 is transferred to the circuit component 16 not only by the radiation but also from the resonator 10 through the first support sections 20 and the substrate 14. Therefore, the temperature of the circuit component 16 can further be kept constant. Further, by using a metal material having a poor thermal conductivity such as 42 alloy, which is an alloy of iron (Fe) combined with nickel (Ni), for the second support sections 22, the heat of the resonator 10 and the substrate 14 can be prevented from being transferred to the base substrate 32, and thus, the temperature of the resonator 10 and the circuit component 16 can further be kept constant.

The cover 34 can be made of a ceramics material, which is the same material as that of the substrate 14, besides the metal material such as kovar. It should be noted that in the case of the metal material, a shield effect is obtained, which is advantageous in preventing an external electrical influence.

Then, a circuit configuration of the electronic device according to the embodiment of the invention will be explained.

As shown in FIG. 2, the circuit of the electronic device 1 is constituted by an oscillator circuit section 40 for oscillating the resonator 10, an amplifier circuit section 46 for amplifying an oscillating signal, a control circuit section 50 for controlling the heating element 12 for keeping the temperature of the resonator constant, and so on.

The oscillator circuit section 40 is constituted by a load capacitance 42 including a variable capacitance element necessary for the oscillation, the circuit component 16 including the amplifier element easily affected by the temperature variation, a filter circuit 44 including an inductor for suppressing a fundamental mode of the vibrating element and making it easy to oscillate in an overtone mode, and so on.

It should be noted that since the variable capacitance element of the load capacitance 42 and the inductor of the filter circuit 44 each have a large variation in constant value due to the variation in ambient temperature, by disposing the variable capacitance element and the inductor in the vicinity of the heating element 12 similarly to the oscillating amplifier element, the variable capacitance element and the inductor can be kept at constant temperature, and thus, it is possible to further stabilize the temperature characteristics of the oscillator circuit for oscillating the resonator 10 to thereby further improve the frequency stability of the electronic device 1.

The control circuit section 50 controls the heating element 12 fixed to the resonator 10 based on the temperature information of a thermo-sensitive element 52 disposed in the vicinity of the resonator 10 to keep the resonator 10 at constant temperature. A heater, a power transistor, or the like is used as the heating element 12, and a thermistor, a temperature-sensing quartz crystal resonator, or the like is used as the thermo-sensitive element 52.

Then, the influences of the distance H between the heating element 12 and the circuit component 16 in the electronic device 1 according to the embodiment of the invention on the various characteristics of the electronic device 1 will be explained based on the measurement results.

Figure 3:
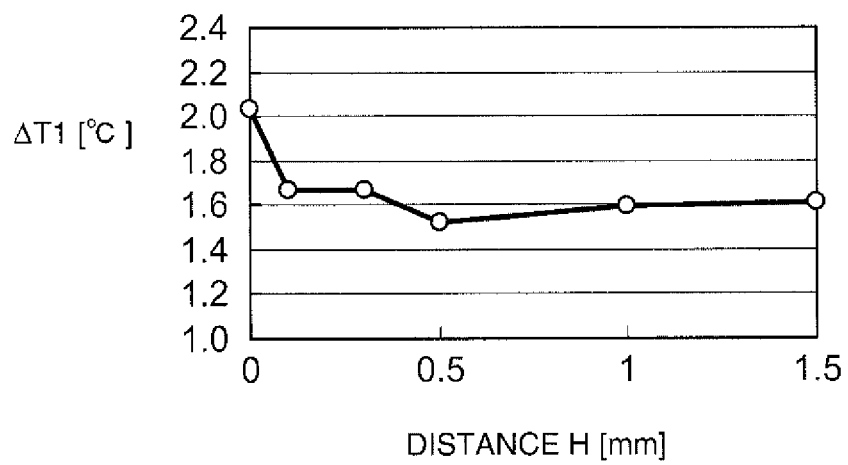
FIG. 3 is a diagram showing a temperature variation of a heating element and a resonator with respect to the distance between the heating element and a circuit component of the electronic device according to the embodiment of the invention.

FIG. 3 is a diagram showing a temperature variation of the heating element and the resonator with respect to the distance between the heating element and the circuit component of the electronic device according to the embodiment of the invention. In the drawing, the surface temperature of the heating element 12 and the resonator 10 is measured while varying the ambient temperature of the electronic device 1 from −40° C. to 80° C., and there is shown how the difference ΔT1 between the highest temperature and the lowest temperature of the heating element 12 and the resonator 10 varies in the case of varying the distance H between the heating element 12 and the circuit component 16.

According to FIG. 3, in the case in which the distance H between the heating element 12 and the circuit component 16 is 0 mm, namely the heating element 12 and the circuit component 16 have contact with each other, ΔT1 is around 2° C., but in the case in which the distance H is equal to or larger than 0.1 mm, there is shown a tendency that ΔT1 is approximately constant at around 1.6° C. It is conceivable that in the case in which the heating element 12 and the circuit component 16 have contact with each other, the heat of the heating element 12 is transferred to the circuit component 16 to thereby absorb the heat for heating the resonator 10, and thus, ΔT1 is increased. Therefore, it is advantageous to set the distance H to be equal to or larger than 0.1 mm for suppressing the current supply to the heating element 12 to a low level.

Figure 4:
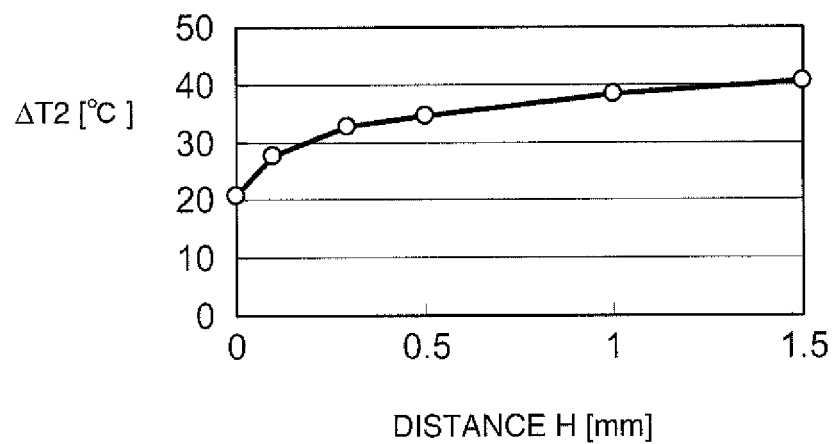
FIG. 4 is a diagram showing a temperature variation of the circuit component with respect to the distance between the heating element and the circuit component of the electronic device according to the embodiment of the invention.

FIG. 4 is a diagram showing a temperature variation of the circuit component with respect to the distance between the heating element and the circuit component of the electronic device according to the embodiment of the invention. In the drawing, the surface temperature of the circuit component 16 is measured under the same condition as in FIG. 3, and there is shown how the difference ΔT2 between the highest temperature and the lowest temperature of the circuit component 16 varies in the case of varying the distance H between the heating element 12 and the circuit component 16.

According to FIG. 4, in the case in which the distance H between the heating element 12 and the circuit component 16 is 0 mm, namely the heating element 12 and the circuit component 16 have contact with each other, ΔT2 is around 20° C., but there is shown a tendency that the temperature difference ΔT2 gradually increases as the distance H increases from 0.1 mm to 1.5 mm. It is conceivable that this is because the heat-transfer efficiency by the radiation is degraded due to the increase in the distance between the heating element 12 and the circuit component 16, and it is advantageous to dispose the heating element 12 and the circuit component 16 so as to have contact with each other in order to approximate the temperature of the circuit component 16 to the temperature of the heating element 12, and then keep the circuit component 16 at constant temperature.

Figure 5A:
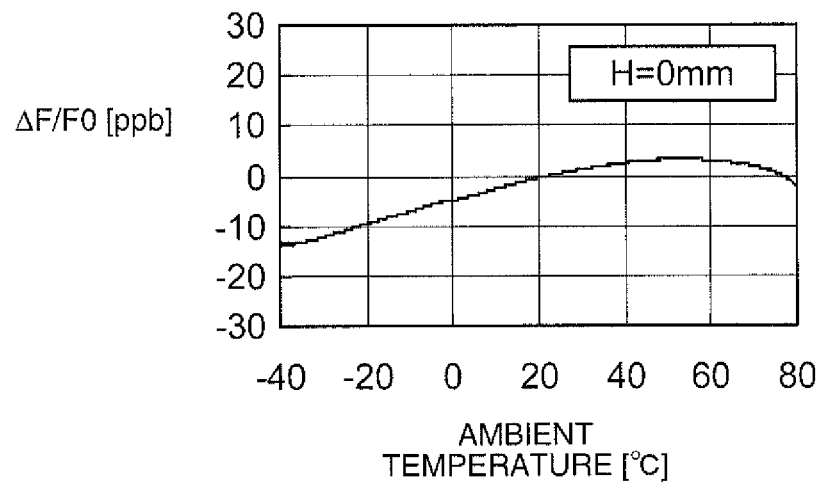
Figure 5B:
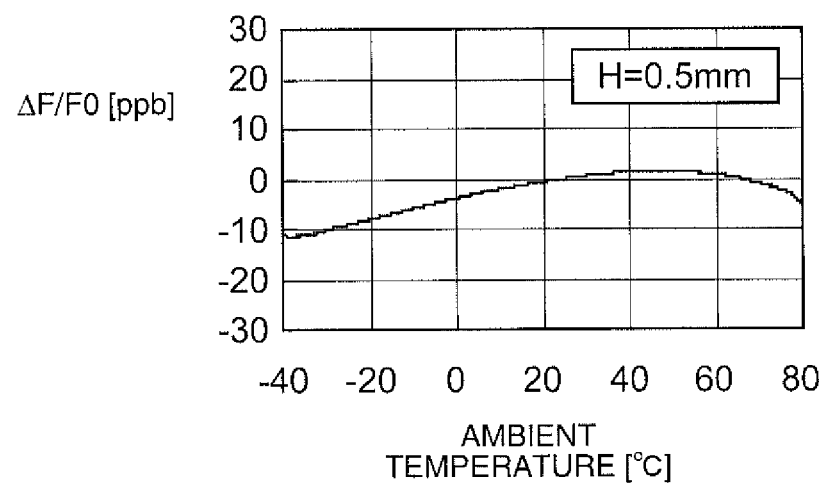
Figure 5C:
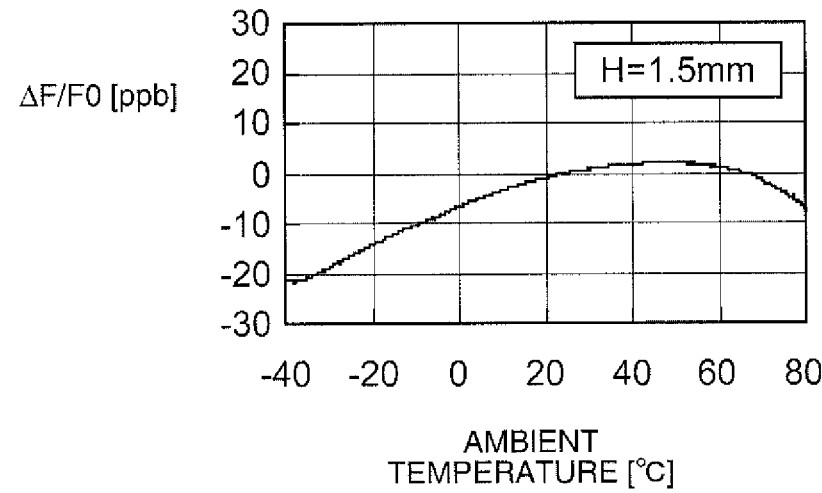

FIGS. 5A through 5C are diagrams showing the temperature characteristics with respect to the distance between the heating element and the circuit component of the electronic device according to the embodiment of the invention, wherein FIG. 5A shows the case in which the distance H is 0 mm, FIG. 5B shows the case in which the distance H is 0.5 mm, and FIG. 5C shows the case in which the distance H is 1.5 mm. It should be noted that in the drawing, the frequency of the electronic device 1 at the ambient temperature of 20° C. is defined as a reference frequency F0, and there is shown a value (ΔF/F0) obtained by dividing the frequency difference ΔF between the frequency F at each of the temperature values and the reference frequency F0 by the reference frequency F0 is shown as the temperature characteristics in a range of the ambient temperature from −40° C. to 80° C.

According to FIGS. 5A through 5C, it is understood that the temperature characteristics are sufficiently small (|ΔF/F0|≤30 ppb in the temperature range: −40° C. through 80° C.) even with the distance H of 1.5 mm although there is shown a tendency that the temperature characteristics are deteriorated as the distance H between the heating element 12 and the circuit component 16 increases. Further, it is understood that temperature characteristics are smaller (|ΔF/F0|≤15 ppb in the temperature range: −40° C. through 80° C.) in a range of the distance H of 0 through 0.5 mm.

Figure 6:
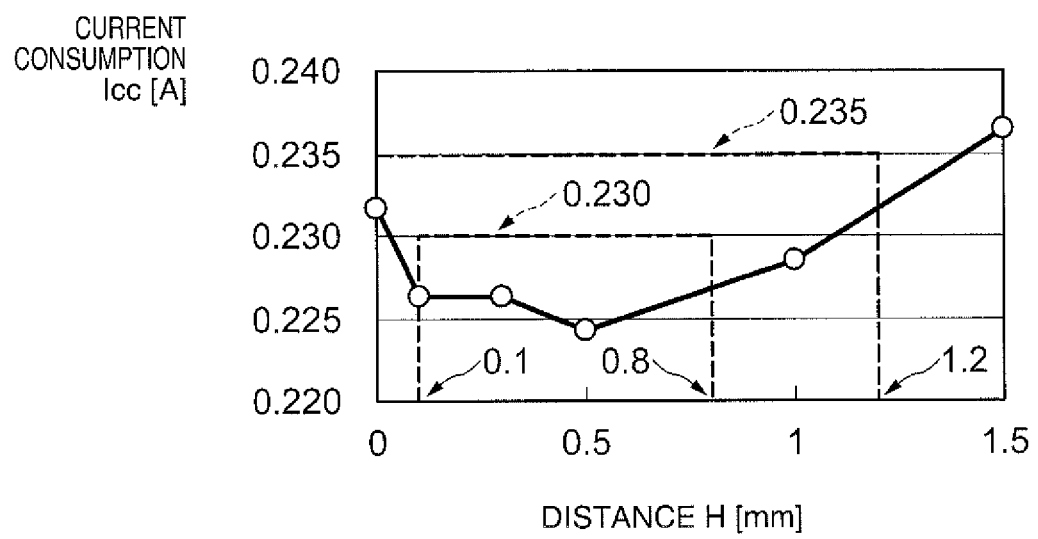
FIG. 6 is a diagram showing a current consumption with respect to the distance between the heating element and the circuit component of the electronic device according to the embodiment of the invention.

FIG. 6 is a diagram showing a current consumption with respect to the distance between the heating element and the circuit component of the electronic device according to the embodiment of the invention.

According to FIG. 6, in the case in which the distance H between the heating element 12 and the circuit component 16 is 0 mm, namely the heating element 12 and the circuit component 16 have contact with each other, the current consumption Icc of the electronic device 1 is about 0.232 A. However, in a range in which the distance H is equal to or longer than 0.1 mm, there is shown a tendency that the current consumption Icc once drops to take the lowest value of about 0.225 A where the distance H takes a value of about 0.5 mm, and then rises to a value of about 0.237 A where the distance H takes a value of about 1.5 mm.

According to the result, it turns out that the current consumption is sufficiently small (not higher than 0.24 A) in a range of the distance H between the heating element 12 and the circuit component 16 from 0 mm to 1.5 mm, and at the same time it becomes clear that the current consumption takes a smaller value (not higher than 0.235 A) in a range of the distance H from 0 mm to 1.2 mm, and takes roughly the lowest value (not higher than 0.23 A) in a range of the distance H from 0.1 mm to 0.8 mm.

According to the results shown in FIGS. 5A to 5C and 6, in the electronic device 1 according to the embodiment of the invention, by setting the distance H between the heating element 12 and the circuit component 16 to the range of not smaller than 0 mm and no larger than 1.5 mm, the temperature characteristics (|ΔF/F0|≤30 ppb in the temperature range: −40° C. through 80° C.) and the current consumption (not higher than 0.24 A) can be maintained in a preferable range. Further, by setting the distance H between the heating element 12 and the circuit component 16 to the range of not smaller than 0 mm and no larger than 1.2 mm, the temperature characteristics ($|\Delta F/F0| \leq 30$ ppb in the temperature range: $-40°$ C. through $80°$ C.) can be maintained in a preferable state, and at the same time, the current consumption can be reduced (not higher than 0.235 A) compared to the case in which the distance H is 1.5 mm. Further, by setting the distance H between the heating element 12 and the circuit component 16 to the range of not smaller than 0.1 mm and no larger than 0.8 mm, the temperature characteristics ($|\Delta F/F0| \leq 30$ ppb in the temperature range: $-40°$ C. through $80°$ C.) can be maintained in a preferable state, and at the same time, the current consumption can further be reduced (not higher than 0.23 A).

Electronic Apparatus

Then, the electronic apparatuses to which the electronic device 1 according to the embodiment of the invention is applied will be explained in detail with reference to FIGS. 7 through 9.

Figure 7:
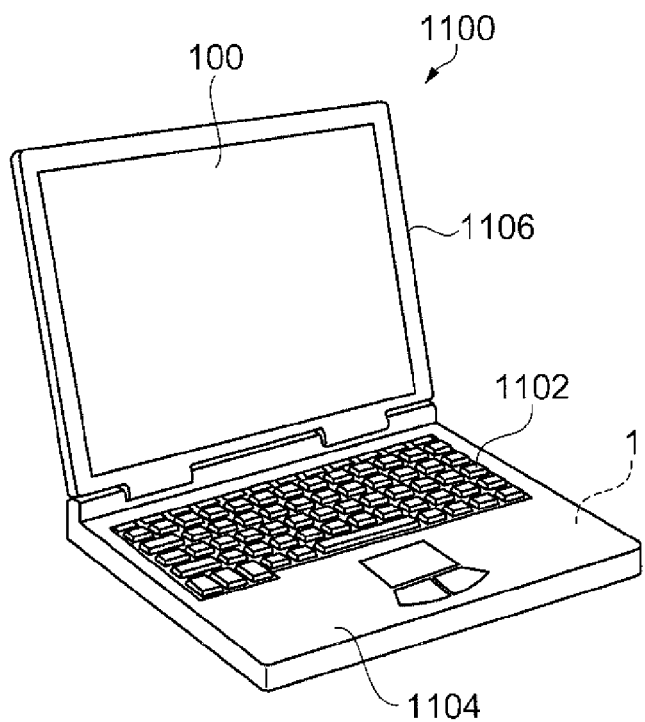
FIG. 7 is a perspective view showing a configuration of a mobile type (or a laptop type) personal computer as an electronic apparatus equipped with the electronic device according to the invention.

FIG. 7 is a perspective view showing a configuration of a mobile type (or a laptop type) of personal computer as the electronic apparatus equipped with the electronic device according to the embodiment of the invention. In the drawing, the personal computer 1100 includes a main body section 1104 provided with a keyboard 1102, and a display unit 1106 provided with a display section 100, and the display unit 1106 is pivotally supported with respect to the main body section 1104 via a hinge structure. Such a personal computer 1100 as described above incorporates the electronic device 1.

Figure 8:
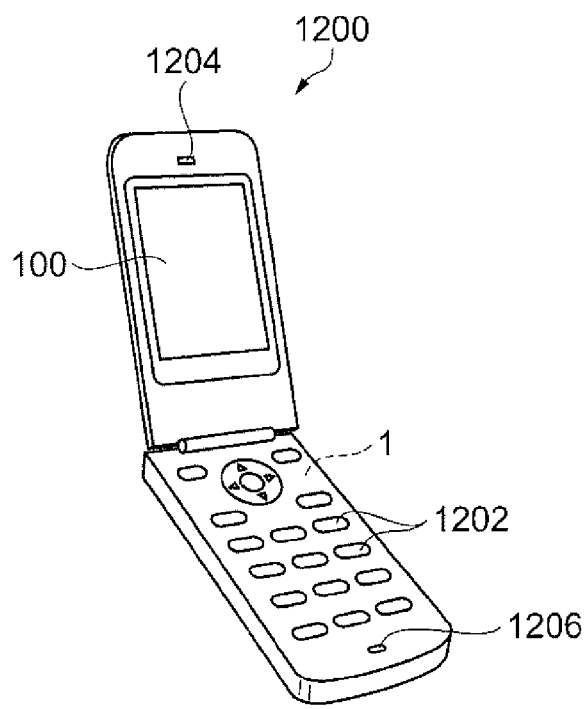
FIG. 8 is a perspective view showing a configuration of a cellular phone (including PHS) as an electronic apparatus equipped with the electronic device according to the invention.

FIG. 8 is a perspective view showing a configuration of a cellular phone (including PHS) as the electronic apparatus equipped with the electronic device according to the embodiment of the invention. In this drawing, the cellular phone 1200 is provided with a plurality of operation buttons 1202, an earpiece 1204, and a mouthpiece 1206, and the a display section 100 is disposed between the operation buttons 1202 and the earpiece 1204. Such a cellular phone 1200 as described above incorporates the electronic device 1.

Figure 9:
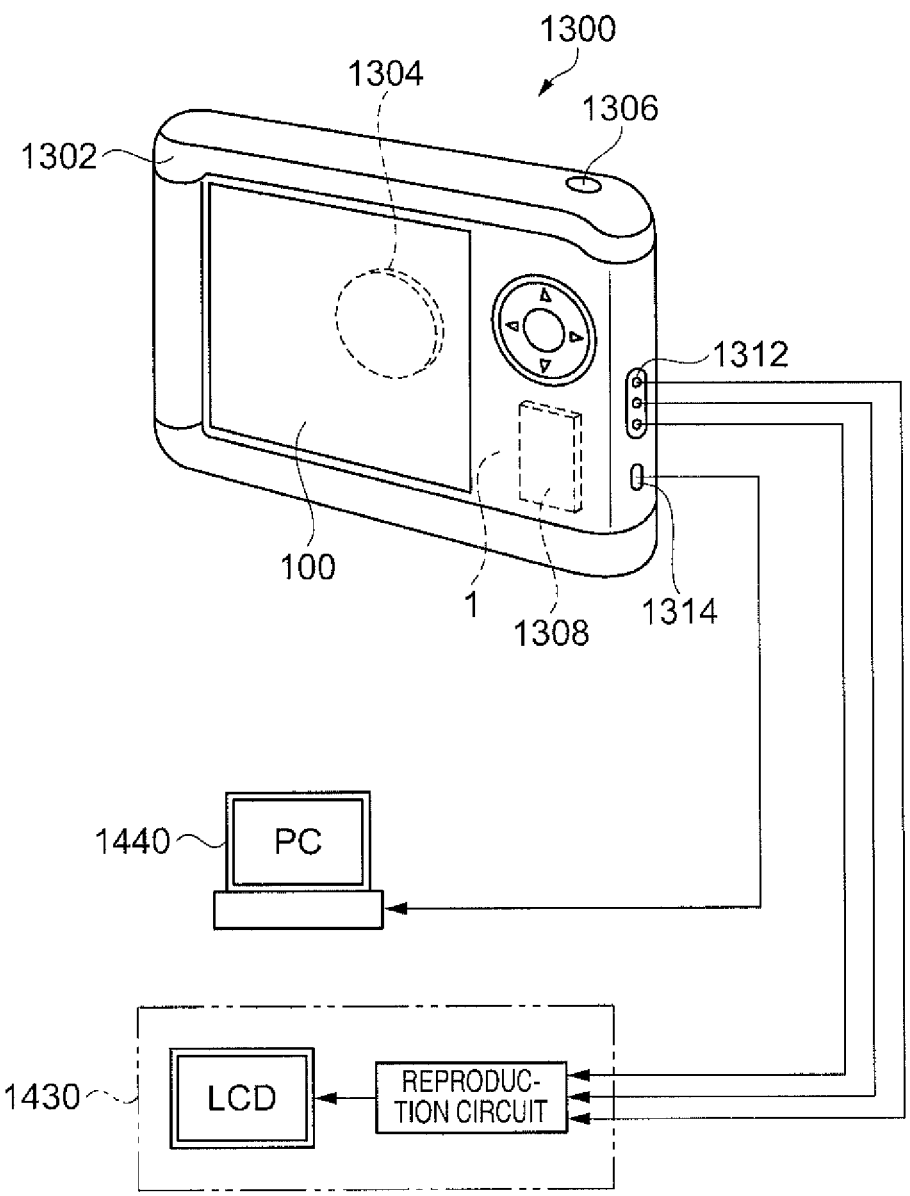
FIG. 9 is a perspective view showing a configuration of a digital camera as an electronic apparatus equipped with the electronic device according to the invention.

FIG. 9 is a perspective view showing a configuration of a digital camera as an electronic apparatus equipped with the electronic device according to the embodiment of the invention. It should be noted that the connection with external equipment is also shown briefly in this drawing. Here, typical cameras expose silver salt films to an optical image of an object on the one hand, the digital camera 1300 performs photoelectric conversion on the optical image of the object by an image capture element such as a CCD (a charge coupled device) to generate an imaging signal (an image signal), on the other hand.

A case (a body) 1302 of the digital camera 1300 is provided with the display section 100 disposed on the back surface thereof to have a configuration of performing display in accordance with the imaging signal from the CCD, wherein the display section 100 functions as a viewfinder for displaying the object as an electronic image. Further, the front surface (the back side in the drawing) of the case 1302 is provided with a light receiving unit 1304 including an optical lens (an imaging optical system), the CCD, and so on.

When the photographer checks an object image displayed on the display section 100, and then holds down a shutter button 1306, the imaging signal from the CCD at that moment is transferred to and stored in a memory device 1308. Further, the digital camera 1300 is provided with video signal output terminals 1312 and an input/output terminal 1314 for data communication disposed on a side surface of the case 1302. Further, as shown in the drawing, a television monitor 1430 and a personal computer (PC) 1440 are respectively connected to the video signal output terminals 1312 and the input/output terminal 1314 for data communication if needed. Further, there is adopted the configuration in which the imaging signal stored in the memory device 1308 is output to the television monitor 1430 and the personal computer 1440 in accordance with a predetermined operation. Such a digital camera 1300 as described above incorporates the electronic device 1.

It should be noted that, as the electronic apparatus equipped with the electronic device 1 according to the embodiment of the invention, there can be cited, for example, an inkjet ejection device (e.g., an inkjet printer), a laptop personal computer, a television set, a video camera, a video recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), a flight simulator, mobile communication base station apparatus, a storage area network apparatus such as a router or a switch, a local area network apparatus, and a transmission device for a network besides the personal computer 1100 shown in FIG. 7, the cellular phone 1200 shown in FIG. 8, and the digital camera 1300 shown in FIG. 9.

Moving Object

Figure 10:
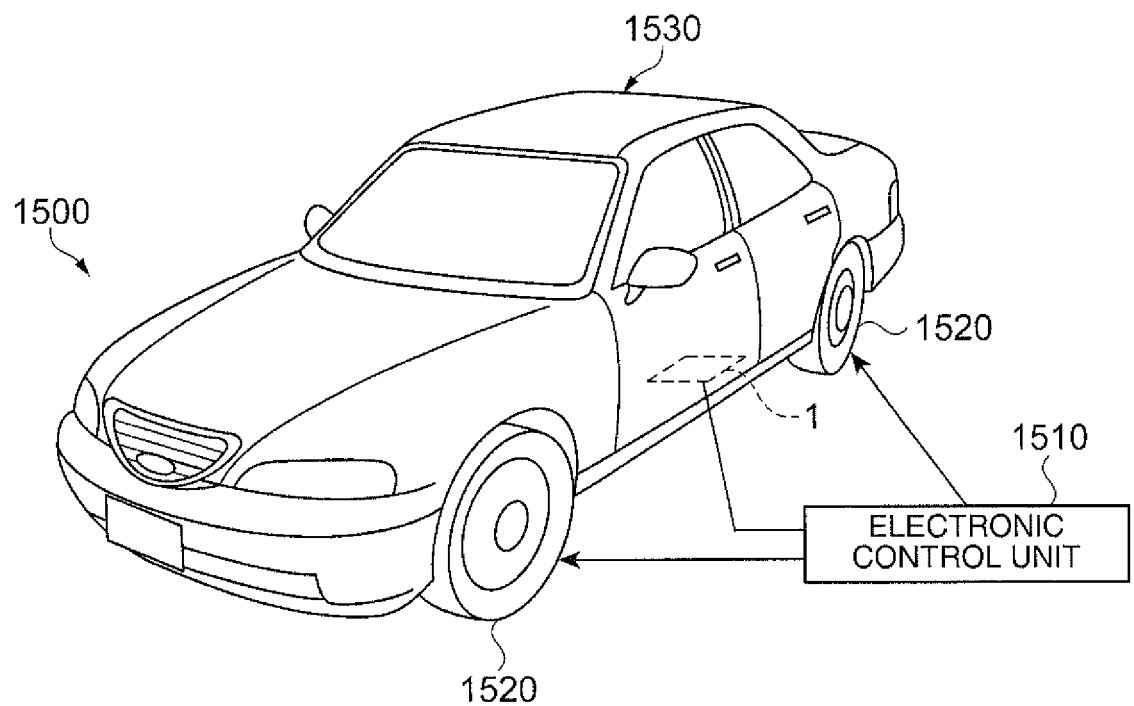
FIG. 10 is a perspective view showing a configuration of a vehicle as a moving object equipped with the electronic device according to the invention.

FIG. 10 is a perspective view schematically showing a vehicle as an example of the moving object. The vehicle 1500 is equipped with the electronic device 1 according to the embodiment of the invention. For example, as shown in FIG. 10, in the vehicle 1500 as the moving object, an electronic control unit 1510 incorporating the electronic device 1 and for controlling tires 1520 and so on is installed in a vehicle body 1530. Further, the electronic device 1 according to the invention can widely be applied to an electronic control unit (ECU) such as a keyless entry system, an immobilizer, a car navigation system, a car air-conditioner, an antilock brake system (ABS), an air-bag system, a tire pressure monitoring system (TPMS), an engine controller, a battery monitor for a hybrid car or an electric car, or a vehicle posture control system besides the above.

Although the electronic device, the electronic apparatus, and the moving object according to the embodiments of the invention are hereinabove explained based on the accompanying drawings, the invention is not limited to the embodiments, but the configuration of each of the constituents can be replaced with one having an arbitrary configuration with an equivalent function. Further, it is also possible to add any other constituents to the invention. Further, it is also possible to arbitrarily combine any of the embodiments.

The entire disclosure of Japanese Patent Application No. 2013-092067, filed Apr. 25, 2013 is expressly incorporated by reference herein.

What is claimed is:

1. An electronic device comprising:
   a resonator;
   a heating element; and
   a circuit component opposed to the heating element, and provided with at least an oscillating amplifier element,
   wherein a distance between the heating element and the circuit component is in a range not smaller than 0 mm and no larger than 1.5 mm, and no components are disposed between the heating element and the circuit component.

2. The electronic device according to claim 1, wherein the distance between the heating element and the circuit component is in a range not smaller than 0 mm and no larger than 1.2 mm.

3. The electronic device according to claim 1, wherein the distance between the heating element and the circuit component is in a range not smaller than 0.1 mm and no larger than 0.8 mm.

4. The electronic device according to claim 1, wherein the heating element covers the circuit component in a plan view.

5. The electronic device according to claim 1, wherein the circuit component is provided with at least an inductor and a variable capacitance element.

6. The electronic device according to claim 1, further comprising:
a first support section disposed on the resonator;
a substrate having the circuit component disposed, and provided with a second support section; and
a package housing the resonator and the substrate,
wherein the first support section is connected to the substrate, and
the second support section is connected to the package.

7. The electronic device according to claim 2, further comprising:
a first support section disposed on the resonator;
a substrate having the circuit component disposed, and provided with a second support section; and
a package housing the resonator and the substrate,
wherein the first support section is connected to the substrate, and
the second support section is connected to the package.

8. The electronic device according to claim 3, further comprising:
a first support section disposed on the resonator;
a substrate having the circuit component disposed, and provided with a second support section; and
a package housing the resonator and the substrate,
wherein the first support section is connected to the substrate, and
the second support section is connected to the package.

9. An electronic apparatus comprising:
The electronic device according to claim 1.

10. A moving object comprising:
The electronic device according to claim 1.

11. An electronic device comprising:
a resonator arranged in an atmosphere;
a heating element arranged in the atmosphere; and
a circuit component provided with at least an oscillating amplifier element, and is arranged in the atmosphere,
wherein a distance between the heating element and the circuit component is in a range not smaller than 0 mm and no larger than 1.5 mm, and only a part of the atmosphere is disposed between the heating element and the circuit component.

* * * * *